United States Patent
Rezeanu

(10) Patent No.: US 7,813,213 B1
(45) Date of Patent: Oct. 12, 2010

(54) PULSED ARBITRATION SYSTEM

(75) Inventor: Stefan-Cristian Rezeanu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 459 days.

(21) Appl. No.: 11/403,647

(22) Filed: Apr. 13, 2006

Related U.S. Application Data

(60) Provisional application No. 60/677,722, filed on May 4, 2005.

(51) Int. Cl.
    G11C 8/00 (2006.01)
(52) U.S. Cl. ............... 365/230.05; 365/189.08; 365/189.07
(58) Field of Classification Search ............ 365/189.08, 365/189.07, 185.23, 230.05
    See application file for complete search history.

(56) References Cited

U.S. PATENT DOCUMENTS

| | | | |
|---|---|---|---|
| 4,535,428 A | 8/1985 | Furman | |
| 4,554,645 A | 11/1985 | Furman | |
| 4,616,347 A | 10/1986 | Bernstein | |
| 4,742,487 A | 5/1988 | Bernstein | |
| 5,036,491 A | 7/1991 | Yamaguchi | |
| 5,276,842 A | 1/1994 | Sugita | |
| 5,289,427 A | 2/1994 | Nicholes et al. | |
| 5,384,734 A | 1/1995 | Tsujihashi et al. | |
| 5,398,211 A | 3/1995 | Willenz et al. | |
| 5,459,851 A | 10/1995 | Nakajima et al. | |
| 5,502,683 A | 3/1996 | Marchioro | |
| 5,737,569 A | 4/1998 | Nadir et al. | |
| 5,768,211 A | 6/1998 | Jones et al. | |
| 5,903,511 A * | 5/1999 | Gillingham ............ | 365/230.06 |
| 5,946,251 A * | 8/1999 | Sato et al. ............... | 365/203 |
| 5,978,897 A | 11/1999 | Nakagawa | |
| 6,934,816 B2 | 8/2005 | Matthews et al. | |
| 2003/0142532 A1 * | 7/2003 | Kang et al. ............. | 365/145 |
| 2003/0231540 A1 * | 12/2003 | Lazar et al. ............ | 365/222 |

OTHER PUBLICATIONS

USPTO Notice of Allowance for U.S. Appl. No. 10/847,531 dated Dec. 30, 2009; 4 pages.
USPTO Miscellaneous Action (Examiner's Answer to Appeal Brief) for U.S. Appl. No. 10/847,531 dated Oct. 19, 2007; 20 pages.
USPTO Advisory Action for U.S. Appl. No. 10/847,531 dated Feb. 20, 2007; 2 pages.
USPTO Final Rejection for U.S. Appl. No. 10/847,531 dated Dec. 14, 2006; 12 pages.
USPTO Non-Final Rejection for U.S. Appl. No. 10/847,531 dated Jul. 17, 2006; 7 pages.
USPTO Miscellaneous Action for U.S. Appl. No. 10/847,531 dated Jun. 19, 2007; 3 pages.
IBM Technical Disclosure Bulletin, "Valid Output Indicator of Multi-Port Arrays," vol. 28, Issue 4, Sep. 1, 1985; pp. 1690-1693; 4 pages.
"16K x 8/9 Dual-Port Static RAM with Sem, Int, Busy," Cypress Semiconductor Data Book, May 1995, CY7C006 and CY7C016, pp. 6:1-17; 10 pages.

(Continued)

*Primary Examiner*—Vu A Le
*Assistant Examiner*—Han Yang

(57) ABSTRACT

A pulsed arbitration without coincidence detection system has a pulsed arbitration circuit that is controlled by an internal write pulse and a block/group row access and that has an output coupled to a sub-word line. A sub-word line area contains the pulsed arbitration circuit.

13 Claims, 4 Drawing Sheets

OTHER PUBLICATIONS

"4K x 16/18 and 8K x 16/18 Dual-Port Static RAM with Sem, Int, Busy," Cypress Semiconductor Data Book, May 1995, CY7CO24/0241 and CY7CO25/0251, pp. 6:18-36; 11 pages.

"1K x 8 Dual-Port Static RAM," Cypress Semiconductor Data Book, May 1995, CY7C130/CY7C131 and CY7C140/CY7C141, pp. 6:37-49; 8 pages.

"2K x 8 Dual-Port Static RAM," Cypress Semiconductor Data Book, May 1995, CY7C132/CY7C136 and CY7C142/CY7C146, pp. 6:50-6:62; 8 pages.

"2K x 16 Dual-Port Static RAM," Cypress Semiconductor Data Book, May 1995, CY7C133 and CY7C143, pp. 6:63-6:73; 7 pages.

"4K x 8 Dual-Port Static RAM and 4K x 8 Dual-Port Static RAM with Semaphores," Cypress Semiconductor Data Book, May 1995, CY7B134 and CY7B135 and CY7B1342, pp. 6:74-6:86; 8 pages.

"4K x8/9 Dual-Port Static RAM with Sem, Int, Busy," Cypress Semiconductor Data Book, May 1995, CY7B138 and CY7B139, pp. 6:87-6:102; 10 pages.

"8K x 8/9 Dual-Port Static RAM with Sem, Int, Busy," Cypress Semiconductor Data Book, May 1995, CY7B144 and CY7B145, pp. 6:103-6:120; 11 pages.

USPTO Notice of Allowance for U.S. Appl. No. 08/688,904 dated Jul. 8, 1997; 3 pages.

USPTO Non-Final Rejection for U.S. Appl. No. 08/688,904 dated Feb. 6, 1997; 5 pages.

USPTO Non-Final Rejection for U.S. Appl. No. 10/847,531 dated Apr. 12, 2010; 9 pages.

* cited by examiner

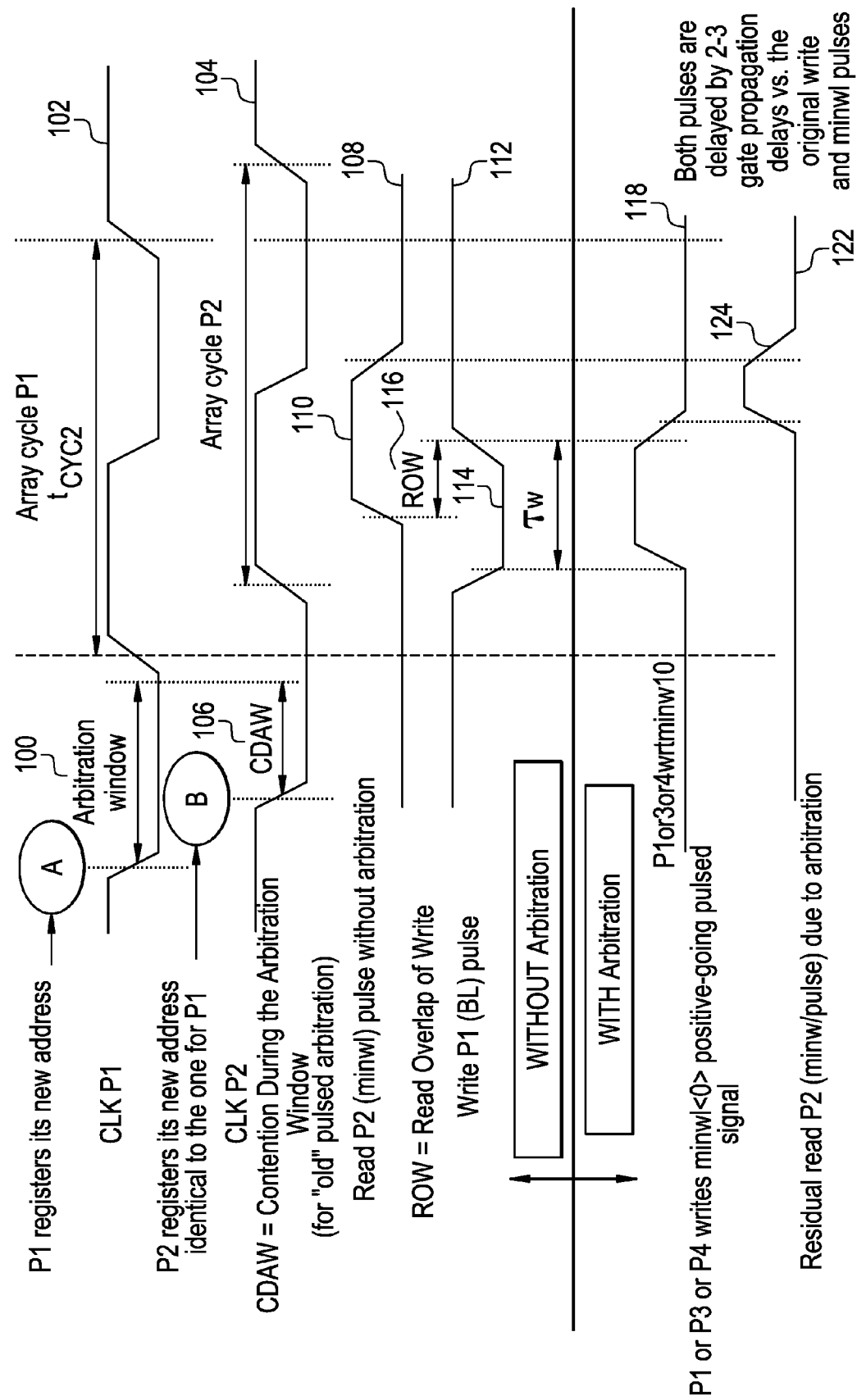

US 7,813,213 B1

PULSED ARBITRATION SYSTEM

RELATED APPLICATIONS

The present application claims priority on the provisional patent having application No. 60/677,722, filed May 4, 2005 and entitled "Pulsed Arbitration Without Address Coincidence Detection System" and is hereby incorporated by reference.

FIELD OF THE INVENTION

The present invention relates generally to the field of electronic memories and more particularly to a pulsed arbitration system and method.

BACKGROUND OF THE INVENTION

Memory circuits with a number of access ports have become very popular and widely used in data communications and processing systems. One of the challenges associated with multi-port memories is how to resolve the situation where at least two ports attempt to access the same memory location at the same time, with at least one of them attempting a write. This situation can result in corruption of the stored data or corruption of the read-out data. A number of arbitration schemes have been proposed. One of the problems with prior art solutions is that they were developed to target two port memories. One arbitration solution is to use a priority scheme that gives priority to one of the ports. A flow chart illustrating the most common system, including the priority scheme solution, is shown in FIG. 1. The process starts, step 10, by determining if two ports are attempting to access the same cell at step 12. When the two ports are not attempting to access the same cell, the process waits for the beginning of the next cycle at step 14, and then repeats. When the two ports are attempting to access the same cell, the arbitration condition is latched favoring the priority channel at step 16. Next, the predecoded lines of the interfering port are inactivated for at least the duration of the overlapping addresses at step 18. This solution results in significantly limiting the performance of the non-priority or lower priority ports. Another problem found in the prior art is that the arbitration system locks out ports when there are multiple reads and no operations. Yet another problem with some of the prior art solutions is that they block the other port's (ports') array access for a complete arbitration-winning-port's clock cycle. Since the port clocks are generally asynchronous, the arbitration-winning-port's clock may have a significantly longer clock cycle than the other port(s) attempting to access the same memory cell. As a result, the losing port(s) may be blocked for multiple clock cycles, significantly reducing its/their performance.

Thus, there exists a need for a multi-port arbitration scheme that does not have priority channels, allows multiple simultaneous reads and does not block a port's memory access for any longer than is necessary.

SUMMARY OF INVENTION

A pulsed arbitration without coincidence detection system that overcomes these and other problems has a pulsed arbitration circuit that has an output coupled to a sub-word line (sometimes labeled as min-word line). A sub-word line area contains the pulsed arbitration circuit. The pulsed arbitration circuit may have a number of port write input signals. The pulse arbitration circuit may logically combine a port one access signal with a port two write signal to generate the output. The port two write signal may be logically combined with a port three write signal. The port one access signal and the port two write signal may gate each other as two of the inputs to a logic (e.g., NOR or NAND) gate.

The pulsed arbitration without coincidence detection system of present invention uses a circuit to disable the sub-word line when two or more ports are attempting to access the same cell and one of the ports is attempting a write. The arbitration circuitry is placed in the sub-word line area of the memory circuit. As a result, the system frees up space in the center of the memory circuit and does not require special timing (e.g., delay matching) circuits. It also eliminates the registers/latches, and as such the possibility of meta-stability issues.

BRIEF DESCRIPTION OF THE DRAWINGS

FIG. 4 is a signaling diagram for pulsed arbitration without coincidence detection system in accordance with one embodiment of the invention.

DETAILED DESCRIPTION OF THE DRAWINGS

The pulsed arbitration without coincidence detection system of present invention uses a circuit to disable the sub-word line (sometimes labeled as min-word line) when two or more ports are attempting to access the same cell and one of the ports is attempting a write. The arbitration circuitry is placed in the sub-word line area of the memory circuit. As a result, the system frees up space in the center of the memory circuit and does not require special timing (e.g., delay matching) circuits. It also eliminates the registers/latches, and with them the possibility of encountering meta-stability issues.

Figure 1:
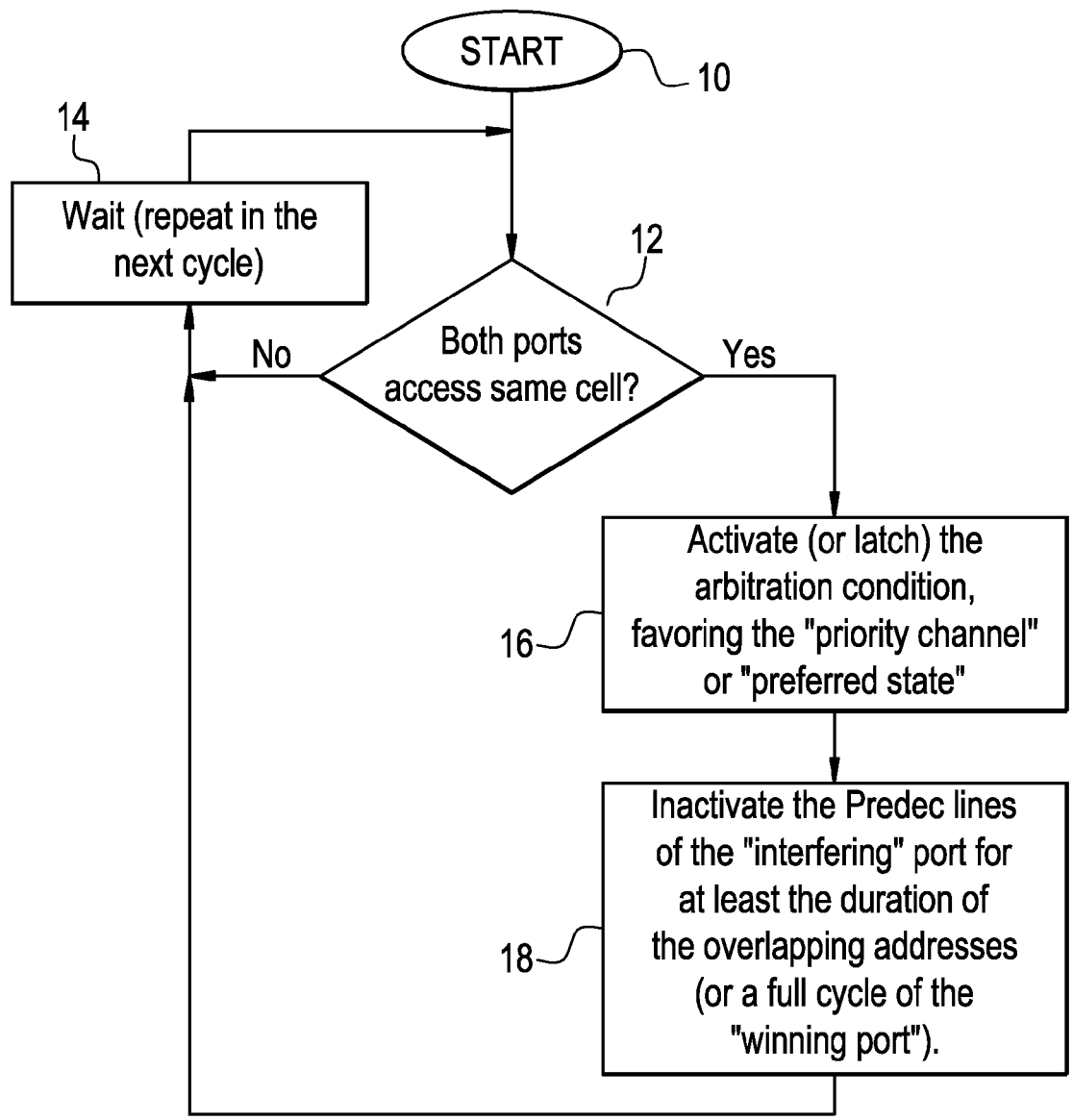
FIG. 1 is a flow chart of the steps used in a previous arbitration circuit solution.
Figure 2:
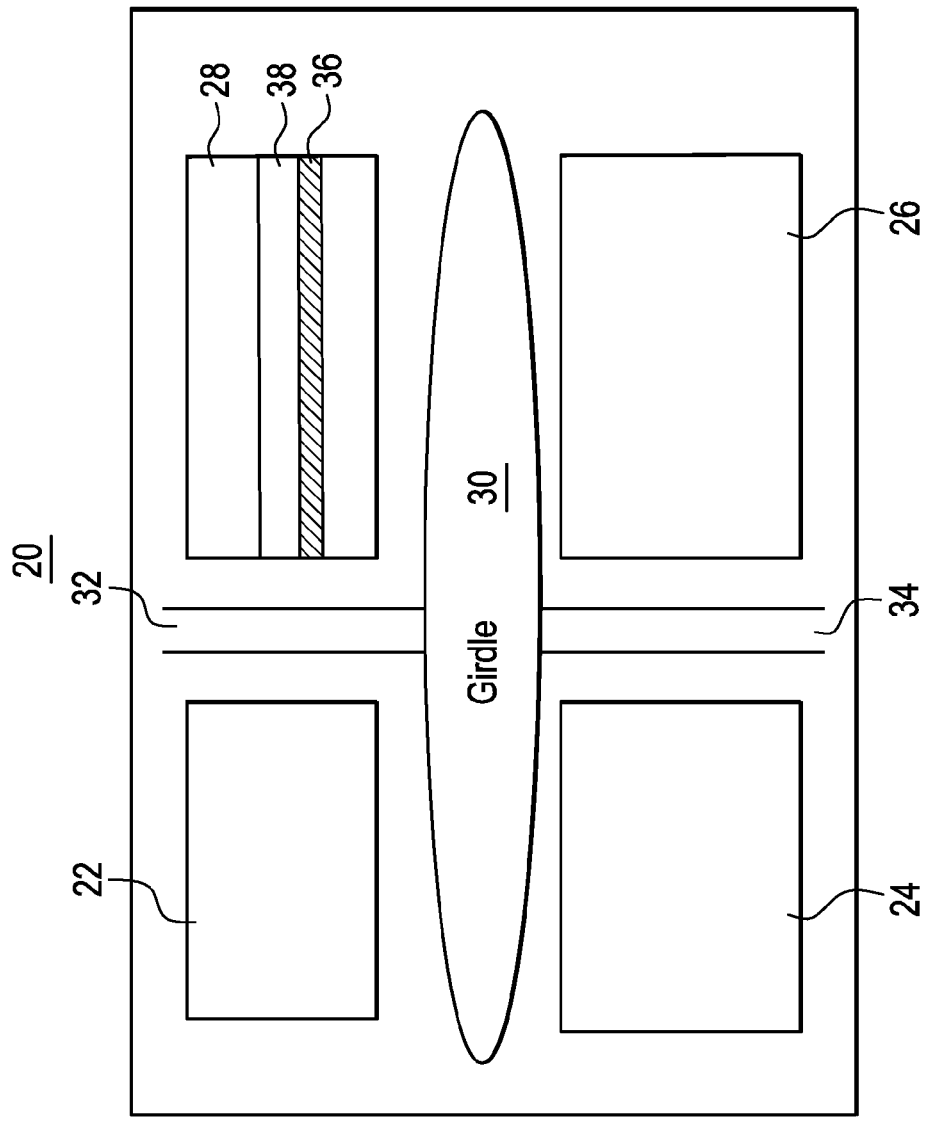
FIG. 2 is a block diagram of a memory system that is capable of using the pulsed arbitration without coincidence detection system in accordance with one embodiment of the invention.

FIG. 2 is a block diagram of a memory system 20 that is capable of using the pulsed arbitration without coincidence detection system in accordance with one embodiment of the invention. In a particular device architecture example, the memory circuit 20 is divided into four blocks (quadrants) 22, 24, 26, 28 of memory cells. The girdle area 30 is where most centralized control circuitry is located. Spines 32, 34 also hold control circuitry that is used to control the data flow in/out of the memory cells. The sub-word line control area 36 is where the (global) word lines are subdivided into sub-word lines (SWL) in order to access a sub-block of memory 38. The pulsed arbitration without coincidence detection system of the present invention is placed in the sub-word line area 36. As a result, the blocking circuit is right next to the memory cell whose access from certain ports may be blocked. This eliminates delay matching issues (e.g., between the address and the read/write control paths) and makes the system readily shrinkable/expandable to any number of ports.

Figure 3:
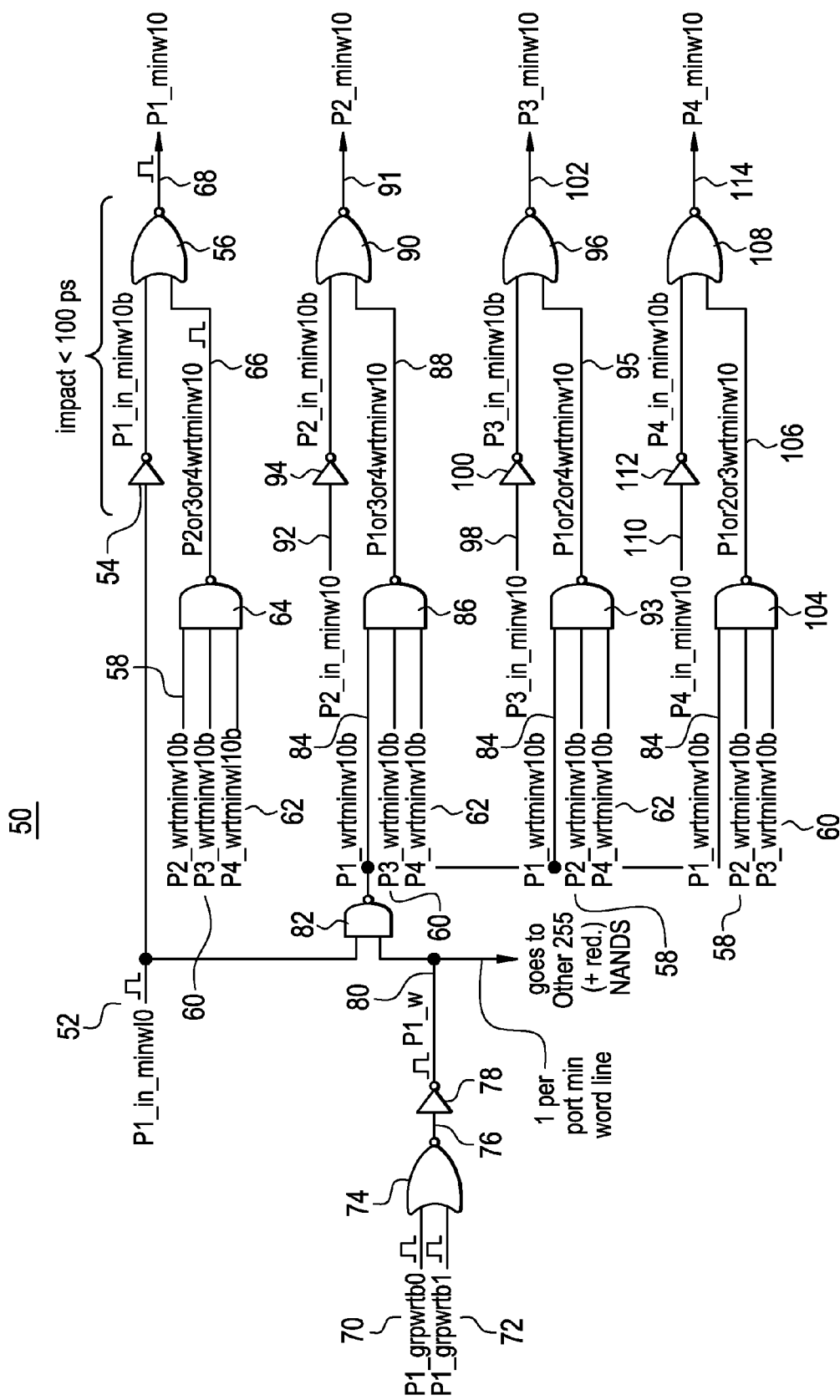
FIG. 3 is a symbolic logic diagram of the pulsed arbitration without coincidence detection system in accordance with one embodiment of the invention for the particular example of a quad port (QP)

FIG. 3 is a symbolic logic diagram of the pulsed arbitration without coincidence detection circuit 50 in accordance with one embodiment of the invention. The particular exemplification is drawn for the case of a quad port (QP). The circuit 50 has a port one read/write min-word line zero input 52 (P1_in_minwl0) that is high when port one is accessing min word line zero. The access signal 52 is coupled to an inverter 54. The output of the inverter is coupled to a NOR gate 56.

The port 2-4 write min-word line zero (bar) signals 58, 60, 62 form the inputs to a NAND gate 64. The output 66, which defines if any of these ports is writing the specific min-word line, forms the second input to the NOR gate 56. The output 68 of the NOR gate 56 is the port one min-word line zero (P1_minwl0) signal that may block the access to port one's min-word line zero during a write by any of the other ports (P2, P3, or P4 in the particular example of a QP).

In a particular example, a port one group write byte zero and byte one signals 70 & 72 form the input to a NOR gate 74. The output 76 is inverted by an inverter 78, and the resulting signal 80 defines whether port one is attempting a write or not. This signal is combined with the port one read/write min-word line zero input 52 (P1_in_minwl0) in NAND gate 82. The output 84 activates when port one is attempting a write using min-word line zero. Similar circuits to 70, 72, 74, 76, 78, 80, and 82 exist for the other ports, but are not shown in order to simplify the drawing.

The port 1, 3-4 write min-word line zero (bar) signals 84, 60, 62 form the inputs to a NAND gate 86. The output 88, which activates when any of these ports is attempting to write the specific min-word line, forms an input to the NOR gate 90. A port two access min-word line zero signal 92 is inverted by inverter 94 and forms an input to NOR gate 90. The output 91 of the NOR gate 90 is the signal that may block the access to port two's min-word line zero during a write by any of the other ports.

The port 1-2 & 4 write min-word line zero (bar) signals 84, 58, 62 form the inputs to a NAND gate 93. The output 95 which activates when any of these ports is attempting to write the specific min-word line, forms an input to the NOR gate 96. A port three access min-word line zero signal 98 is inverted by inverter 100 and forms an input to NOR gate 96. The output 102 of the NOR gate 96 is the signal that may block the access to port three's min-word line zero during a write by any of the other ports.

The port 1-3 write min-word line zero (bar) signals 84, 58, 60 form the inputs to a NAND gate 104. The output 106 which activates when any of these ports is attempting to write the specific min-word line, forms an input to the NOR gate 108. A port four access min-word line zero signal 110 is inverted by inverter 112 and forms an input to NOR gate 108. The output 114 of the NOR gate 108 is the signal that may block the access to port four's min-word line zero during a write by any of the other ports. As will be apparent to those skilled in the art, this circuit may be shrunk (in the case of a dual port—DP) or expanded for any number of ports, and the particular gate types may be swapped (e.g., NORs for NANDs) depending on the polarity of the signals used and/or the chosen implementation of the presented logic functionality FIG. 4 is a signaling diagram for pulsed arbitration without coincidence detection in accordance with one embodiment of the invention. For illustration purposes the colliding ports are assumed to be of the same frequency and the address and write pulses at the cell level are depicted as having equal widths. The arbitration window 100 is slightly smaller than "tCYC2/2" (where tCYC2 is the duration of the full clock cycle corresponding to the maximum frequency), so that the arbitration pulse width is equal to a write pulse ($T_W$) plus a margin of error.

The first trace 102 shows the clock of port one (P1). The second trace 104 shows the clock of port two (P2) and the contention during the arbitration window (CDAW) 106. The third trace 108 shows the P2 read (Sub-Word Line: SWL) pulse 110 in the case when arbitration is not used. The fourth trace 112 shows the write (at the Bit Line: BL-level) pulse 114 for P1 and the read overlap of write (ROW) duration 116. If this is allowed to occur it can result in an unsuccessful write or corrupted read-data operation. The next traces show the difference when arbitration is enabled. The fifth trace 118 illustrates the case when P1 or P3 or P4 is/are attempting to write on min-word line zero (minwl0). The sixth trace 122 is the residual read (SWL) pulse 124 for P2, cut short due to the blocking effect of the arbitration scheme. In the case shown with activated arbitration, the result of the read is not guaranteed—as illustrated in the diagram by the residual read port's (P2) SWL pulse. However, the arbitration protects the write operation. In the example, the user is violating the tCCS (clock-to-clock set-up time) data sheet specification. In order to have a valid read, after a write from another port at the same address, the user has to wait at least tCCS, which is usually slightly shorter than the tCYC2. In one exemplary embodiment, a device with a tCYC2 of 6 ns would have a tCCS of around 5 ns, and the internal write BL pulse width ($T_W$) and address pulse duration would be around 2 ns. This would be visible in a situation where the reading port's (P2) clock slides to the right with respect to the writing port's (P1) clock, to the point where there is no read overlap of write (ROW) but there is still a contention during the arbitration window (CDAW).

Thus there has been described a pulsed arbitration without coincidence detection system of present invention a read/write detector so that two or more ports all attempting to just read the same memory location will not be blocked. When at least one of the ports is attempting a write, the other (reading) colliding ports are only blocked for a part of their read cycle (the portion that overlaps the internal write pulse of the writing port).

The methods described herein can be implemented as computer-readable instructions stored on a computer-readable storage medium that when executed by a computer will perform the methods described herein.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A pulsed arbitration system, comprising:
a pulsed arbitration circuit comprising an output coupled to a sub-word line of a global word line and further comprising a plurality of port, write input signals, wherein the output of the pulsed arbitration circuit is configured to block a write by a port based on a logical combination of the plurality of port write signals; and
a sub-word line area including the pulsed arbitration circuit and a sub-word line driver configured to control sub-block memory access through the sub-word line area.

2. The system of claim 1, wherein the pulse arbitration circuit is configured to generate the logical combination by logically combining a port one access signal with a port two write signal to generate the output.

3. The system of claim 2, wherein the port two write signal is logically combined with a port three write signal.

4. The system of claim 3, wherein the port one access signal and the port two write signal form the inputs to a NOR gate.

5. The system of claim 4, wherein an output of the NOR gate blocks an access to port one's min-word line zero during a write by any of the other ports.

6. The system of claim 1, wherein the output of the pulsed arbitration circuit blocks an access to port two's min-word line zero during a write by any of the other ports.

7. A pulsed arbitration system, comprising:

a pulsed arbitration circuit comprising an input configured to receive a write signal, logic coupled with the input, wherein the logic is configured to block the write based on a logical combination of a plurality of port write signals, and an output coupled with the logic and configured to control a sub-word line of a global word line.

8. The system of claim 7, wherein the pulsed arbitration circuit is located in a sub-word line area.

9. The system of claim 7, wherein the pulsed arbitration circuit receives the plurality of write signals from a plurality of ports.

10. The system of claim 9, wherein a subset of the plurality of write signals from a subset of the plurality of ports are logically combined to form a subset write indicator signal.

11. The system of claim 9, wherein each of the write signals of the subset of the plurality of write signals is associated with a specific cell.

12. The system of claim 10, wherein the subset write indicator signal is logically combined with a read indicator signal from a port outside the subset of the plurality of ports.

13. The system of claim 12, wherein each of the write signals of the subset of the plurality of write signals is associated with a specific cell, and wherein the read indicator signal is associated with the specific cell.

* * * * *